(12) United States Patent
Koyama et al.

(10) Patent No.: US 8,096,049 B2
(45) Date of Patent: Jan. 17, 2012

(54) METHOD OF MANUFACTURING A MULTILAYER WIRING BOARD

(75) Inventors: Tetsuya Koyama, Nagano (JP);
Tsuyoshi Kobayashi, Nagano (JP);
Hiroyuki Kato, Nagano (JP); Yoshihiro Machida, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 12/929,090

(22) Filed: Dec. 30, 2010

(65) Prior Publication Data
US 2011/0099806 A1 May 5, 2011

Related U.S. Application Data

(62) Division of application No. 12/007,040, filed on Jan. 4, 2008, now Pat. No. 7,882,627.

(51) Int. Cl.
*H01K 3/00* (2006.01)

(52) U.S. Cl. .............. 29/849; 29/852; 29/829; 174/260; 174/261; 174/262; 439/44

(58) Field of Classification Search .................. 29/830, 29/849, 825, 852; 361/750; 307/42; 439/44, 439/49, 65, 66, 74, 85; 174/260–262, 113, 174/116, 120 R
See application file for complete search history.

(56) References Cited

U.S. PATENT DOCUMENTS

| | | | |
|---|---|---|---|
| 5,382,757 A | 1/1995 | Ishida | |
| 6,693,361 B1 * | 2/2004 | Siniaguine et al. | 257/777 |
| 6,828,668 B2 * | 12/2004 | Smith et al. | 257/696 |
| 6,975,516 B2 * | 12/2005 | Asahi et al. | 361/761 |
| 7,102,219 B2 * | 9/2006 | Hanaoka et al. | 257/686 |
| 7,178,233 B2 | 2/2007 | Nakamura et al. | |
| 7,663,891 B2 | 2/2010 | Tanaka et al. | |
| 2002/0030245 A1 * | 3/2002 | Hanaoka et al. | 257/621 |
| 2002/0180025 A1 * | 12/2002 | Miyata et al. | 257/690 |

(Continued)

FOREIGN PATENT DOCUMENTS
EP 1780790 A2 * 5/2007
(Continued)

OTHER PUBLICATIONS

Korean Office Action dated Aug. 17, 2010, with English Translation.
(Continued)

*Primary Examiner* — Derris Banks
*Assistant Examiner* — Jeffrey T Carley
(74) *Attorney, Agent, or Firm* — Kratz, Quintos & Hanson, LLP

(57) ABSTRACT

First, a unilayer wiring board is fabricated, which has wiring layers formed in desired shapes on both sides of an insulating base member; and a metal bump formed on the wiring layer on one side of the insulating base member. Then, a desired number of unilayer boards are prepared and stacked up. On that case, the board disposed in the uppermost layer is prepared without having a metal bump. The boards are positioned and stacked up in such a manner that a metal bump of one of adjacent boards is connected to a corresponding wiring layer of the other board. Thereafter, resin is filled into gaps between the stacked boards, and insulating layers are formed on both sides of a multilayer board obtained through the above steps, in such a manner as to cover the entire surface except pad areas defined at predetermined positions on the wiring layers.

7 Claims, 14 Drawing Sheets

U.S. PATENT DOCUMENTS

| | | | |
|---|---|---|---|
| 2006/0121253 A1 | 6/2006 | Davenport et al. | |
| 2008/0099911 A1* | 5/2008 | Machida | 257/723 |
| 2008/0184555 A1* | 8/2008 | Machida | 29/830 |
| 2009/0246474 A1* | 10/2009 | Sakurai et al. | 428/172 |

FOREIGN PATENT DOCUMENTS

| | | |
|---|---|---|
| JP | 12-332369 | 11/2000 |
| JP | 2005-303133 | 10/2005 |
| JP | 2008-172076 A * | 7/2008 |
| KR | 10-0601483 | 7/2006 |
| KR | 2006-117250 | 11/2006 |

OTHER PUBLICATIONS

Korean Office Action dated Feb. 12, 2010, with partial English Translation.

* cited by examiner

METHOD OF MANUFACTURING A MULTILAYER WIRING BOARD

CROSS-REFERENCE TO RELATED APPLICATIONS

This application is a Divisional application of Ser. No. 12/007,040 filed on Jan. 4, 2008, which is now U.S. Pat. No. 7,882,627, which is based on and claims priority of Japanese Patent Application No. 2007-004595 filed on Jan. 12, 2007, the entire contents of which are incorporated herein by reference.

BACKGROUND OF THE INVENTION (a) Field of the Invention

The present invention relates to a technique of manufacturing a wiring board for use in mounting of a chip component such as a semiconductor device, and more particularly to a method of manufacturing a multilayer wiring board (also called a "semiconductor package") having a multilayer structure adapted to achieve high density and high performance.

(b) Description of the Related Art

Heretofore, a build-up process has been widely used as a technique of manufacturing a multilayer wiring board. The use of the build-up process enables the fabrication of a variety of multilayer wiring boards by using combinations of materials (typified by resins) for an interlayer dielectric and via hole formation processes. A typical manufacturing process of the build-up process involves stacking up layers on both sides (top and bottom sides) of a core substrate serving as a base member by repeating in turn the formation of resin layers (insulating layers) on both sides of the substrate, the formation of via holes in the resin layers, and the formation of conductive patterns (wiring layers) on the resin layers and also in the via holes.

As the art related to such multilayer wiring board formation, for example, Japanese unexamined Patent Publication (JPP) 2001-15922 discloses the following technique. In this technique, a conductive bump is caused to pass through an uncured insulating material substrate (prepreg) by pressing, against the prepreg, a conductor layer provided with the conductive bump. Here, the conductive bump is substantially conically molded from a resin containing an electrically conductive material such as metal powder dispersed therein. The insulating material substrate is made of a sheet of a thermosetting resin such as epoxy resin. Thereby, the conductive bump ensures electrical conduction in a thickness direction of the insulating material substrate.

As described above, a typical wiring formation technique using the conventional build-up process has a disadvantage of requiring a considerable time due to adopting the approach of stacking the resin layers (having the via holes formed therein) and the conductor layers alternately one on top of another, starting from the inside (or the core substrate side). In particular, this technique poses a problem of requiring a longer time period for manufacturing a larger number of stacked layers. This is because the larger the number of stacked layers, the greater the amount of needed workloads.

Moreover, since a multilayer wiring structure is manufactured through a formation process in which layers are formed one by one, the yield of the formation process is the sum of yields throughout all steps in the formation process. For example, where a defective condition is encountered at any one of the steps or at every step, a multilayer wiring board obtained as a final product is judged as a "defective," the shipment of which is not permitted. In other words, the approach, such as the build-up process, of stacking up the layers one by one in sequence has a problem of causing a reduction in the yield of the product (the multilayer wiring board).

In addition, a great difference in thermal expansion coefficient exists between a constituent material for the conductor layer, such as copper (Cu), and a constituent material for the resin layer, such as epoxy resin. Accordingly, the adoption of the approach of stacking up the conductor layers and the resin layers alternately at given time intervals poses a problem in that "warpage" may occur because thermal stress depending on the difference in the thermal expansion coefficient may be generated in the thickness direction of the layers at interfaces between the conductor layers and the resin layers during the stacking-up process.

SUMMARY OF THE INVENTION

An object of the present invention is to provide a method of manufacturing a multilayer wiring board, which is capable of reducing a time period for manufacture, achieving an improvement in yield, and preventing warpage from occurring.

To attain the above object, according to a first aspect of the present invention, there is provided a method of manufacturing a multilayer wiring board, including the steps of: fabricating a unilayer wiring board having wiring layers formed in desired shapes on both sides of an insulating base member by means of patterning, and having a metal bump formed on the wiring layer on one side of the insulating base member; preparing and stacking up a desired number of unilayer wiring boards, including preparing the board disposed in the uppermost layer without having a metal bump, and positioning and stacking up the boards in such a manner that a metal bump of one of adjacent boards is connected to a corresponding wiring layer of the other board; filling resin into gaps between the stacked boards; and
forming insulating layers on both sides of a multilayer board obtained through the above steps, in such a manner that the insulating layers cover the entire surface except pad areas defined at predetermined positions on the respective wiring layers.

Also, according to a modification of the first aspect, there is provided a method of manufacturing a multilayer wiring board, including the steps of: fabricating a unilayer wiring board having wiring layers formed in desired shapes on both sides of an insulating base member by means of patterning, and having a, metal bump formed on the wiring layer on one side of the insulating base member; preparing and stacking up a desired number of unilayer wiring boards, including preparing the board disposed in the uppermost layer without having a metal bump, and positioning and stacking up the boards in such a manner that a metal bump of one of adjacent boards is connected to a corresponding wiring layer of the other board; filling resin into gaps between the stacked boards; preparing and stacking up a desired number of multilayer boards obtained through the above steps, including preparing the multilayer board disposed inside with a metal bump formed on the wiring layer on one side thereof, and positioning and stacking up the multilayer boards in such a manner that a metal bump of one of adjacent multilayer boards is connected to a corresponding wiring layer of the other multilayer board; filling resin into gaps between the stacked multilayer boards; and forming insulating layers on both sides of a structure obtained through the above steps, in such a manner that the insulating layers cover the entire surface except pad areas defined at predetermined positions on the respective wiring layers.

According to the method of manufacturing a multilayer wiring board according to the first aspect (or its modification) of the present invention, the unilayer wiring boards (or the multilayer boards each formed of a stack of a desired number of unilayer boards) are separately fabricated, and a desired number of unilayer boards (or multilayer boards) are appropriately stacked up to thereby form a multilayer wiring structure. Accordingly, the method according to the present invention can reduce a time period for manufacture, as compared with a conventional method using a build-up process.

A conventional manufacturing method using the build-up process has posed a problem of causing a reduction in the yield of a product (or the multilayer wiring board), because, even if a defective condition is encountered at any one of all steps, the multilayer wiring board obtained as a final product is judged as a "defective," the shipment of which is not permitted. As opposed to this, the manufacturing method according to the present invention can achieve an improvement in the yield as compared with the conventional method, since, where a defective condition is encountered at any one of the steps, the method of the present invention can discard the defective unilayer wiring board (or the multilayer board) alone.

Further, the method according to the present invention can achieve the multilayer wiring structure having strength and hence no warp, since the resin is filled into the gaps between the boards after the stacking of the desired number of unilayer wiring boards (or multilayer boards) one on top of another.

Also, according to a second aspect of the present invention, there is provided a method of manufacturing a multilayer wiring board, including the steps of: fabricating a unilayer wiring board having wiring layers formed in desired shapes on both sides of an insulating base member by means of patterning, having a metal post formed on the wiring layer on at least one side of the insulating base member, and having an electrically conductive material formed on the top of the metal post; preparing and stacking up a desired number of unilayer wiring boards, including preparing the boards disposed in at least the uppermost and lowermost layers without having a metal post and an electrically conductive material, and positioning and stacking up the boards in such a manner that the wiring layers of the boards are interconnected through metal posts and electrically conductive materials formed on the boards disposed inside; filling resin into gaps between the stacked boards; and forming insulating layers on both sides of a multilayer board obtained through the above steps, in such a manner that the insulating layers cover the entire surface except pad areas defined at predetermined positions on the respective wiring layers.

Also, according to a modification of the second aspect, there is provided a method of manufacturing a multilayer wiring board, including the steps of: fabricating a unilayer wiring board having wiring layers formed in desired shapes on both sides of an insulating base member by means of patterning, having a metal post formed on the wiring layer on at least one side of the insulating base member, and having an electrically conductive material formed on the top of the metal post; preparing and stacking a desired number of unilayer wiring boards, including preparing the boards disposed in at least the uppermost and lowermost layers without having a metal post and an electrically conductive material, and positioning and stacking up the boards in such a manner that the wiring layers of the boards are interconnected through metal posts and electrically conductive materials formed on the boards disposed inside; filling resin into gaps between the stacked boards; preparing and stacking up a desired number of multilayer boards obtained through the above steps, including preparing the multilayer board disposed inside with a metal post formed on the wiring layer on at least one side thereof and with an electrically conductive material formed on the top of the metal post, and positioning and stacking up the multilayer boards in such a manner that the wiring layers of the multilayer boards are interconnected through metal posts and electrically conductive materials formed on the multilayer boards disposed inside; filling resin into gaps between the stacked multilayer boards; and forming insulating layers on both sides of a structure obtained through the above steps, in such a manner that the insulating layers cover the entire surface except pad areas defined at predetermined positions on the respective wiring layers.

As in the case of the method of manufacturing a multilayer wiring board according to the first aspect (or its modification) mentioned above, the method of manufacturing a multilayer wiring board according to the second aspect (or its modification) of the present invention can also achieve the same functional effects as the manufacturing method according to the first aspect (or the modification thereof). Specifically, the functional effects include the reduction in the time period for manufacture, the improvement in the yield, and the prevention of the occurrence of warpage. This is because basically the same approach as the method according to the first aspect (or the modification thereof) is adopted, regardless of the difference between the first aspect (or its modification) and the second aspect (or its modification) in that the first aspect (or its modification) uses the metal bump as inter-board connection means, whereas the second aspect (or its modification) uses the metal post and the electrically conductive material as the inter-board connection means.

Detailed description will be given with reference to embodiments of the present invention to be described later, with regard to other features in process, advantages based thereon, and the like, of the method of manufacturing a multilayer wiring board according to the present invention.

DESCRIPTION OF THE PREFERRED EMBODIMENTS

Description will be given below with regard to preferred embodiments of the present invention with reference to the accompanying drawings.

First Embodiment See FIGS. 1 to 6

Figure 1:
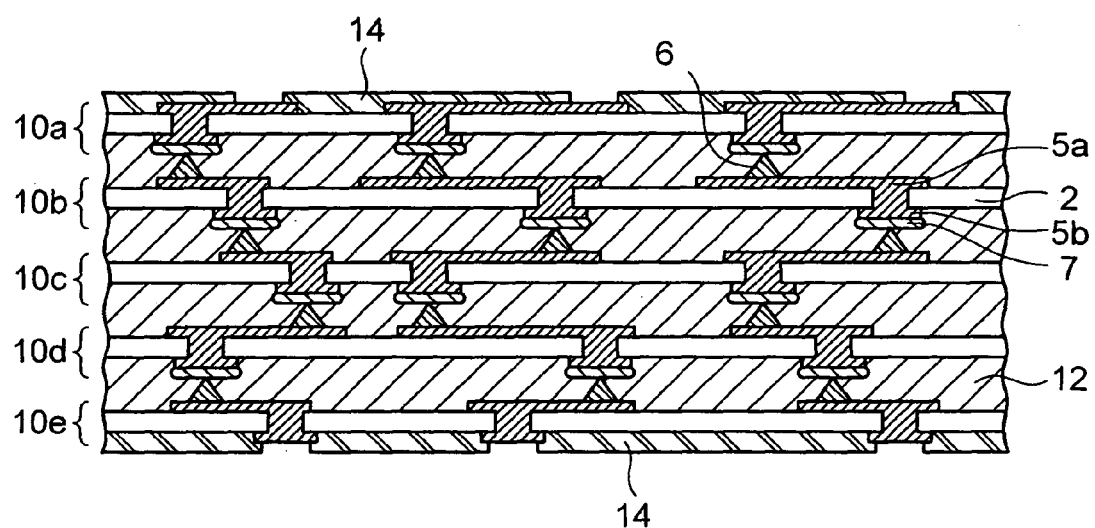
FIG. 1 is a cross-sectional view showing an example of the configuration of a multilayer wiring board as manufactured by use of a method of manufacturing a multilayer wiring board according to a first embodiment of the present invention.

FIG. 1 shows in cross-sectional view an example of the configuration of a multilayer wiring board as manufactured by use of a method of manufacturing a multilayer wiring board according to a first embodiment of the present invention.

As shown in FIG. 1, a multilayer wiring board 20 according to the first embodiment includes five boards 10a, 10b, 10c, 10d and 10e that are fundamental structures that constitute the board 20, resin layers 12 formed in such a manner as to fill in between the boards, and insulating layers 14 that function as protection films formed on the outermost layers of the board 20 (on top of and on bottom of the board 20). Of the boards 10a to 10e, the boards other than the uppermost and lowermost boards 10a and 10e, namely, the boards 10b, 10c and 10d, each have wiring layers 5a and 5b formed in desired shapes on both sides of an insulating base member 2 (e.g., a prepreg) by means of patterning. The boards 10b, 10c and 10d each have a metal bump (e.g., a gold (Au) bump 6 as employed in the first embodiment) that functions as an interboard connection terminal, which is formed at a predetermined position on the wiring layer 5a on one surface of the prepreg 2 (on top of the prepreg 2), and an electrically conductive material (e.g., solder 7 as employed in the first embodiment) deposited at a predetermined position on the wiring layer 5b on the other surface of the prepreg 2 (on the underside of the prepreg 2).

The uppermost board 10a has only the solder 7 deposited on the wiring layer 5b on the lowerside thereof, and the lowermost board 10e has only the Au bump 6 formed on the wiring layer 5a on the upperside thereof. The boards 10a to 10e are electrically interconnected through the Au bumps 6 and the solders 7, as shown in FIG. 1. Each of the boards 10a to 10e will be hereinafter also called a "unilayer wiring board" for the sake of convenience in that they are each a single board having the wiring layers on both sides.

The insulating layers 14 that function as the protection films are formed in such a manner as to cover the entire surfaces except pad areas defined at predetermined positions on the wiring layers 5a and 5b of the uppermost and lowermost boards 10a and 10e. Electrode terminals of a chip component such as a semiconductor device mounted on the board 20 are connected through solder bumps or the like to the pad areas exposed from the insulating layer 14 at the top. Metal bumps (or balls), metal pins, or the like, which function as external connection terminals for use in packaging of the board 20 on a motherboard or the like, are bonded through solder or the like to the pad areas exposed from the insulating layer 14 at the bottom.

Figure 2:
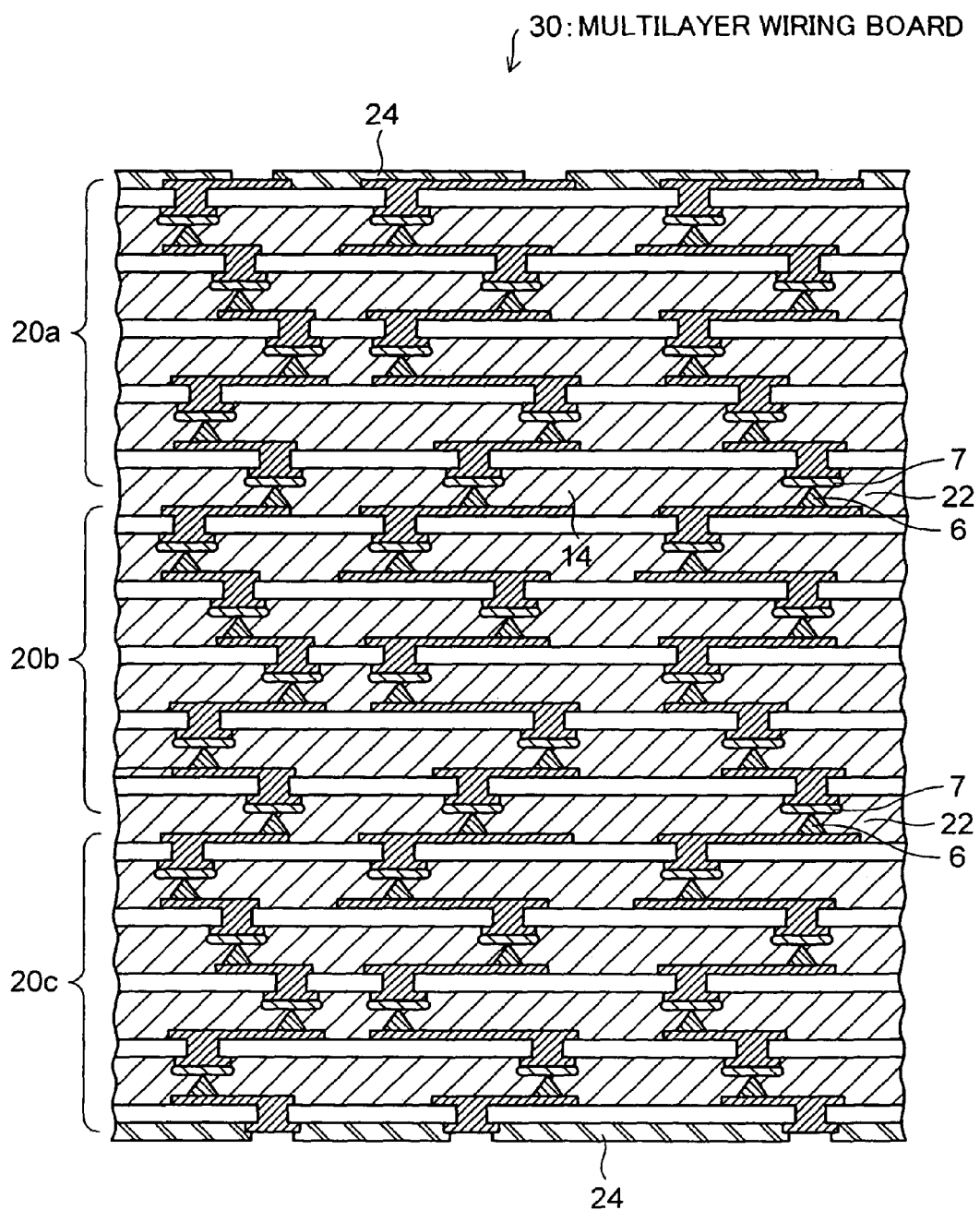
FIG. 2 is a cross-sectional view showing another example of the configuration of a multilayer wiring board as manufactured by use of the method of manufacturing a multilayer wiring board according to the first embodiment of the present invention.

FIG. 2 shows in cross-sectional view another example of the configuration of a multilayer wiring board as manufactured by use of the method of manufacturing a multilayer wiring board according to the first embodiment of the present invention.

As shown in FIG. 2, a multilayer wiring board 30 according to this embodiment is configured of a stack of three structures 20a, 20b and 20c, each of which has basically the same configuration as the multilayer wiring board 20 shown in FIG. 1. Incidentally, the structures 20a to 20c are electrically interconnected through the Au bumps 6 formed in one of two adjacent structures (e.g., the structures 20a and 20b and the structures 20b and 20c as shown for example in FIG. 2) and the solder 7 formed in the other structure. Moreover, resin layers 22 are formed in such a manner as to fill in between the structures 20a and 20b and between the structures 20b and 20c (two gaps), and insulating layers 24 that function as protection films are formed on the outermost layers of the board 30 (on top of and on bottom of the board 30). Likewise, the insulating layers 24 are formed in such a manner as to cover the entire surfaces, except the pad areas on the uppermost and lowermost wiring layers. Each of the structures 20a to 20c will be hereinafter also called a "multilayer board" unless otherwise specified.

Specific description will be given with regard to materials for structural members that constitute the multilayer wiring board 20 (FIG. 1) and the multilayer wiring board 30 (FIG. 2) according to the first embodiment, the sizes of the structural members, and others, in connection with a process to be described below.

Description will be given below with regard to a method of manufacturing the multilayer wiring boards 20 and 30 (FIGS. 1 and 2) with reference to FIGS. 3A to 6 illustrating manufacturing steps in the method in sequence.

First, description will be given with regard to a method of fabricating the fundamental structure (unilayer wiring board) that constitutes the multilayer wiring boards 20 and 30 according to the first embodiment.

Figure 3A:
FIGS. 3A to 3F are cross-sectional views showing steps in the method of manufacturing a multilayer wiring board according to the first embodiment.

Referring to FIGS. 3A to 3F and first to FIG. 3A, there is shown a double-sided copper-clad laminate 1, which is prepared at a first step. For the double-sided copper-clad laminate 1, a core substrate for general use in a multilayer wiring board based on a build-up process can be utilized. Formation of the double-sided copper-clad laminate 1 can be accomplished by laminating a desired number of prepregs to thereby form the prepreg 2 (with a thickness of 60 µm, for example), then placing copper foil 3 on both sides of the prepreg 2, and then applying heat and pressure to the copper foil 3. The prepreg 2 is a bonding sheet in half-cured, B-stage state, made of glass cloth that is a reinforcement material, the glass cloth being impregnated with a thermosetting resin such as epoxy resin, polyimide resin or BT resin.

Figure 3B:
Figure 3C:
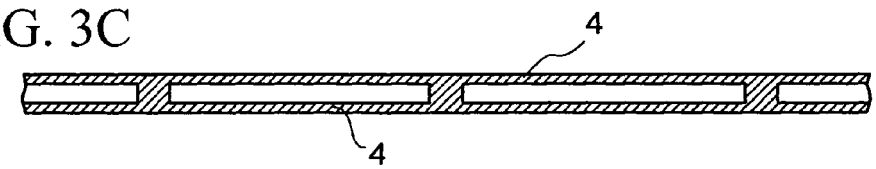

At the next step (FIG. 3B), through holes TH are formed in the double-sided copper-clad laminate 1 at predetermined positions (e.g., three positions as shown in FIG. 3B). The through holes TH are formed by such processes as a hole formation process using a $CO_2$ (carbon dioxide) laser, a YAG (yttrium aluminum garnet) laser, an excimer laser, or the like, and a hole formation process using a mechanical drill.

At the next step (FIG. 3C), conductor layers 4 are formed on both sides of the double-sided copper-clad laminate 1 in such a manner as to fill in the through holes TH formed in the double-sided copper-clad laminate 1, by means of copper electroless plating and copper electroplating.

At the next step (FIG. 3D), the wiring layers 5a and 5b of desired shapes are formed on both sides of the prepreg 2 of the double-sided copper-clad laminate 1. Specifically, etching resists are first formed by use of a patterning material on the conductor layers 4 formed on both sides, and openings are formed in predetermined areas in the resists. The opening areas are formed by means of patterning according to the desired shapes of wiring patterns to be formed. A photosensitive dry film or a liquid photoresist can be used as the patterning material.

For example, with the use of the dry film, resist layers R1 are formed by first cleaning the surfaces of the conductor layers 4; then laminating the dry films (each having a thickness of the order of 25 μm) to the conductor layers 4 by means of thermocompression bonding; curing the dry films by subjecting the dry films to exposure under ultraviolet (UV) irradiation by use of masks (not shown) formed in the desired shapes of the wiring patterns by means of patterning; and further, etching away areas to be removed by use of a predetermined developing solution (e.g., an organic-solvent-containing developing solution for a negative resist or an alkali-base developing solution for a positive resist), thereby yielding the resist layers R1 according to the desired shapes of the wiring patterns. Likewise, with the use of the liquid photoresist, the resist layers R1 formed in the desired shapes by means of patterning can be obtained through process steps of, in turn, surface cleaning, resist surface covering, drying, exposure, and development.

Figure 3D:
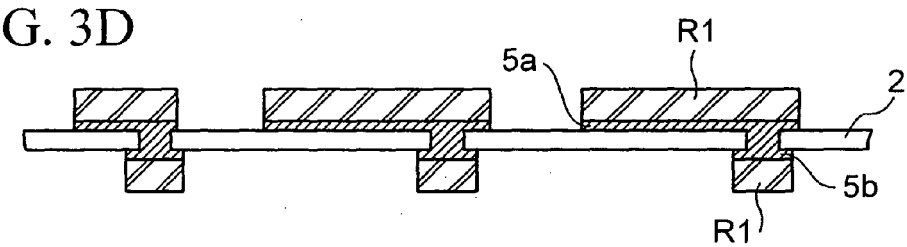

Then, the conductor layers (Cu) 4 in exposed areas are removed by means of wet etching using a chemical liquid soluble only in copper (Cu), using as masks the resist layers R1 formed by means of patterning (as shown in FIG. 3D). Thereafter, the resist layers R1 are removed by use of, for example, an alkaline chemical liquid such as sodium hydroxide or a monoethanolamine-base liquid. Thereby, the wiring layers 5a and 5b of the desired shapes are exposed.

Further, the surfaces of the wiring layers 5a and 5b are cleaned, and thereafter, pretreatment for a next step (i.e., bump formation) takes place, which involves subjecting bump formation regions on the wiring layers to, for example, nickel (Ni) plating in order to prevent Cu of the wiring layers from diffusing into metal (e.g., Au as employed in this instance) deposited at the next step.

Figure 3E:
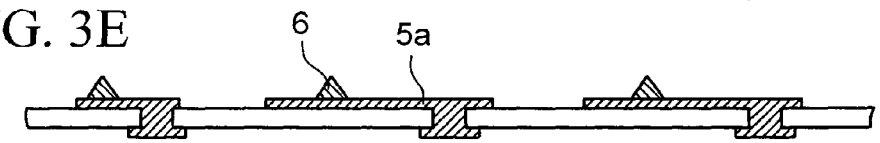
Figure 3F:
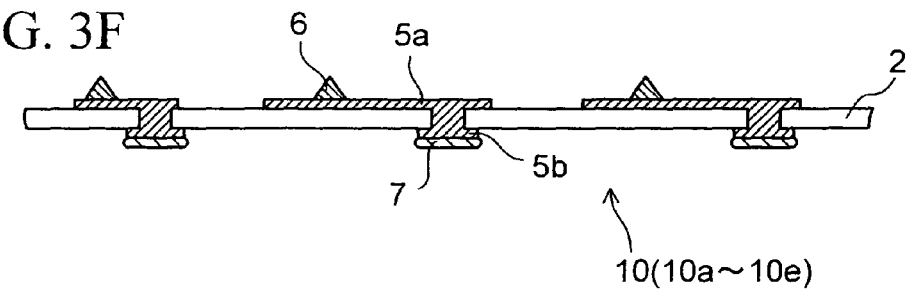

At the next step (FIG. 3E), the Au bumps 6 in protruding form are formed at the predetermined positions (in the bump formation regions) on the wiring layer 5a on one side of the insulating base member 2 (on the top as shown in FIG. 3E). The Au bumps 6 are formed by such methods as electroplating method using photo-process, transfer bump method, and ball bumps using application of wire bonding technology. The transfer bump method involves temporarily forming the Au bumps on a temporary substrate for bump formation and bonding the Au bumps to an inner lead of a tape carrier by means of thermocompression bonding. The Au bumps 6 are formed with a height of the order of 40 to 60 μm, for example.

Further, pretreatment takes place, which involves laminating an protection film (not shown) to the wiring layer 5a having the Au bumps 6 formed thereon (the wiring layer 5a on the top) in order to prevent solder powder for use in a next step from adhering to the wiring layer 5a.

At the next step (FIG. 3F), the solder 7 is deposited on the exposed wiring layer, namely, the wiring layer 5b opposite to the Au bumps 6 formed (or the wiring layer 5b on the underside). Deposition of the solder 7 on the surface of the wiring layer 5b can be accomplished, for example, by forming an adhesive layer on the surface of a target for deposition (e.g., the wiring layer 5b on the underside, as employed in this instance), bringing the solder powder (made of a solder alloy of lead-free (Pb-free) composition, such as a tin-silver (Sn—Ag) base or tin-zinc (Sn—Zn) base alloy) into adhesion to the wiring layer 5b, and melting the solder powder by means of reflow.

Besides this method, for example, screen printing method or the like, may be used to deposit the solder 7, which involves feeding solder paste to the target for deposition (or the wiring layer 5b), melting the solder paste by heat, and air-cooling the solder paste. Alternatively, solder electroplating may be used to deposit the solder 7. After the solder 7 has been deposited in this manner, the protection film (not shown) laminated to the wiring layer 5a on the top is delaminated and thereby removed.

The above steps lead to fabrication of the structure (unilayer wiring board 10) having the wiring layers 5a and 5b formed in the desired shapes on both sides of the prepreg 2 by means of patterning, the Au bumps 6 formed on the wiring layer 5a on one side of the insulating base member 2, and the solder 7 formed on the wiring layer 5b on the other side of the insulating base member 2.

At the next step (FIG. 4), a desired number of unilayer wiring boards 10 fabricated through the above steps are stacked up. First, five unilayer wiring boards 10 (10a to 10e) are prepared. Of the five boards, the board 10a to be disposed in the uppermost layer is prepared without having the Au bump 6 (without undergoing the process shown in FIG. 3E), and the board 10e to be disposed in the lowermost layer is prepared without having the solder 7 (without undergoing the process shown in FIG. 3F).

Then, the boards 10a, 10b, 10c, 10d and 10e are stacked up, as aligned in such a manner that the Au bumps 6 of one of adjacent boards are connected to the solder 7 of the other board. "Pin lamination" is utilized for this stacking. This method is to pin the relative positions of the boards by fitting guide pins into reference holes for positioning previously disposed at predetermined positions on the peripheries of the boards. Thereby, the five unilayer wiring boards 10a to 10e are electrically interconnected through the corresponding Au bumps 6 and solder 7.

Further, a reflow furnace and baking are used in combination as needed to melt the solder 7 and thereby provide tight connections to the Au bumps 6. Incidentally, a reflow process or the like is not necessarily required, and press bonding using molding pressure alone for connections between the Au bumps 6 and the solder 7 can ensure sufficient electrical connections therebetween.

At the next step (FIGS. 5A and 5B), the resin 12 is filled into gaps (or four gaps) between adjacent boards of the unilayer wiring boards 10a to 10e stacked up at the previous step. Filling with the resin 12 is for the purpose of imparting strength to the board of multilayer structure and thereby preventing warpage.

A thermoplastic epoxy resin for general use in a molding resin, a liquid epoxy resin for general use in an underfill resin, or the like is used as a material for the filling resin 12. The thermoplastic epoxy resin has a modulus of elasticity of 15 to 30 GPa and a coefficient of thermal expansion (CTE) of 5 to 15 ppm per degree. Further, this resin contains about 70% to 90% of a filler added thereto (e.g., fine particles of inorganic matter such as silica, alumina, or calcium silicate) in order to adjust the modulus of elasticity and the CTE of the resin, and others. The liquid epoxy resin has a modulus of elasticity of 5 to 15 GPa and a CTE of 20 to 40 ppm per degree and contains about 60% to 80% of a filler added thereto. Preferably, transfer molding can be used as a filling method for the resin 12. Besides the transfer molding, a method such as injection molding or underfill flow molding may be used.

On the occasion of the filling with the resin 12, when the resin is filled into all gaps (the gaps between the adjacent boards of the boards 10a to 10e) at a time, the resin does not always flow uniformly into the gaps between the boards under uniform pressure, depending on pressure for resin injection. Hence, in this case, a disadvantageous situation can possibly arise where smooth resin filling is impossible. In the present embodiment, therefore, in order to avoid such a disadvantageous situation, the resin 12 is first filled into two inner gaps (the gap between the boards 10b and 10c and the gap between the boards 10c and 10d) (FIG. 5A), and after a lapse of a given time, the resin 12 is then filled into two outer gaps (the gap between the boards 10a and 10b and the gap between the boards 10d and 10e) (FIG. 5B). On this occasion, the order in which the resin in the corresponding gaps undergoes vacuum suction on the opposite side to the resin filling side (e.g., on the left side as shown for example in FIGS. 5A and 5B) is changed according to resin injection order. When a "time lag" is provided to fill the resin 12 into the gaps between the adjacent boards of the boards 10a to 10e in time sequence as mentioned above, smooth resin filling becomes possible.

Incidentally, although in this step (FIGS. 5A and 5B) the vacuum suction order of the resin is changed to provide the "time lag," it is to be, of course, understood that the means for providing the "time lag" is not limited to this. For example, the construction of a mold for use in the resin filling may be changed to provide the "time lag." Specifically, the construction of the mold can be changed so that the mold has relatively short paths for the injection of the resin into the two inner gaps and relatively long paths for the injection of the resin into the two outer gaps. Although this step involves first filling the resin into the two inner gaps and then filling the resin into the two outer gaps, it is to be, of course, also understood that the resin filling may take place in reverse order. Of course, it is to be further understood that the number of gaps filled with the resin at a time is not limited to two as is the case with this step but may be appropriately selected.

The above steps lead to fabrication of the structure (the multilayer board 20a) formed of a stack of the five unilayer wiring boards 10a to 10e, having the resin layers 12 formed in such a manner as to fill in between the stacked boards.

When, at this stage, solder resist layers (the insulating layers 14) that function as the protection films are formed on the outermost layers of the structure (on top of and on the underside of the multilayer board 20a), the multilayer wiring board 20 shown in FIG. 1 can be manufactured. The solder resist layers 14 can be formed in the same manner as the process performed at the step shown in FIG. 3D. Specifically, the formation of the solder resist layers 14 can be accomplished by laminating the photosensitive dry films or by applying coverings of the liquid photoresist, and forming the resists in desired shapes by means of patterning.

To manufacture the multilayer wiring board 30 shown in FIG. 2, the process proceeds to a next step without forming the protection films (the solder resist layers 14) at this stage.

Specifically, at the next step (FIG. 6), a desired number of multilayer boards fabricated through the above steps are stacked up. First, three multilayer boards are prepared. One of the three multilayer boards is the multilayer board 20a fabricated through the above steps (see FIG. 5B), and the other two, namely, multilayer boards 20b and 20c, are different from the multilayer board 20a in the pattern shapes of the wiring layers 5a and 5b, the dispositions of the Au bumps 6, the disposition of the solder 7, and so on. The multilayer board 20b disposed inside has the Au bumps 6 formed on one side of the insulating base member 2 (on the top), and the solder 7 formed on the other side (on the underside) of the insulating base member 2 by means of printing method. The multilayer board 20a disposed at the top has the solder 7 formed only on one side (on the underside), and the multilayer board 20c disposed at the bottom has the Au bumps 6 formed only on one side (on the top).

Then, the multilayer boards 20a, 20b and 20c are stacked up, as aligned in such a manner that the Au bumps 6 of one of adjacent multilayer boards are connected to the solder 7 of the other multilayer board. On this occasion, pin lamination is used to pin the relative positions of the multilayer boards in the same manner as the process performed at the step shown in FIG. 4. Thereby, the three multilayer boards 20a to 20c are electrically interconnected through the Au bumps 6 and the solder 7.

Further, the resin 22 (FIG. 2) is filled into gaps (two gaps) between the adjacent boards of the multilayer boards 20a to 20c stacked up, by means of transfer molding or the like. This leads to fabrication of the structure formed of a stack of the three multilayer boards 20a to 20c, having the resin layers 22 formed in such a manner as to fill in between the stacked multilayer boards.

When solder resist layers (the insulating layers 24) that function as the protection films are then formed on the outermost layers of the structure (on top of and on the underside of the structure), the multilayer wiring board 30 shown in FIG. 2 can be manufactured. The solder resist layers 24 can be formed in the same manner as the formation of the solder resist layers 14 (FIG. 1) mentioned above.

According to the method of manufacturing a multilayer wiring board according to the first embodiment (FIGS. 3A to 6), as described above, the unilayer wiring boards (10a to 10e) that serve as the fundamental structures that constitute the multilayer wiring board are fabricated separately, and a desired number of unilayer boards are appropriately stacked up to thereby form a multilayer wiring structure (the multilayer wiring board 20 shown in FIG. 1). Moreover, the multilayer boards (20a to 20c) each formed, as a unit, of the stack of the desired number of unilayer boards are fabricated separately, and a desired number of multilayer boards are appropriately stacked up to thereby form a multilayer wiring structure (the multilayer wiring board 30 shown in FIG. 2). Consequently, the method according to the first embodiment can greatly reduce a time period required for manufacture, as compared with a conventional multilayer wiring formation method using the build-up process.

A conventional manufacturing method using the build-up process has posed a problem of causing a reduction in the yield of a product (the multilayer wiring board), because, even if a defective condition is encountered at one of all steps, the multilayer wiring board obtained as a final product is judged as a "defective," the shipment of which is not permitted. As opposed to this, the manufacturing method according to the first embodiment can achieve a great improvement in the yield as compared with the conventional method, since, if a defective condition is encountered at any one of the steps, the method according to the embodiment can discard defective parts alone (e.g., the unilayer wiring board acting as a fundamental unit or the multilayer board acting as a unit, as employed in this instance) and use, in place of the defective parts, a non-defective unit (e.g., the unilayer wiring board or the multilayer board) having the same function as the parts.

Moreover, the method according to the first embodiment can achieve the multilayer wiring structure having strength and hence no warp, since the resin is filled into the gaps between the boards after the stacking of the desired number of unilayer wiring boards or multilayer boards.

Figure 4:
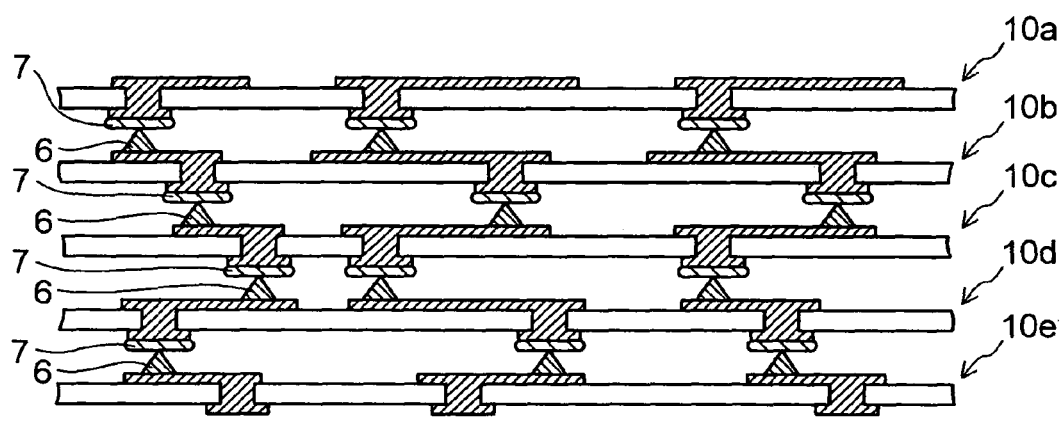
FIG. 4 is a cross-sectional view showing a step following the steps shown in FIGS. 3A to 3F.
Figure 5A:
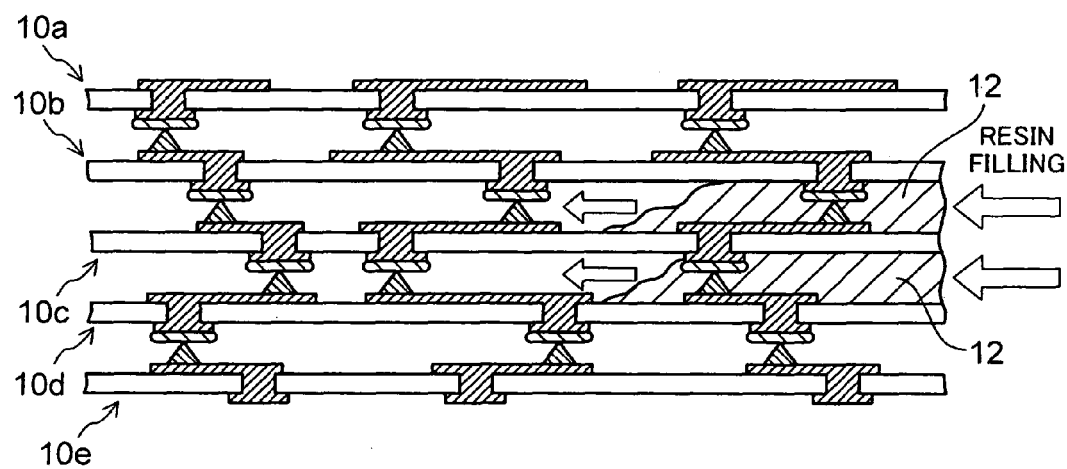
FIGS. 5A and 5B are cross-sectional views showing steps following the step shown in FIG. 4.
Figure 5B:
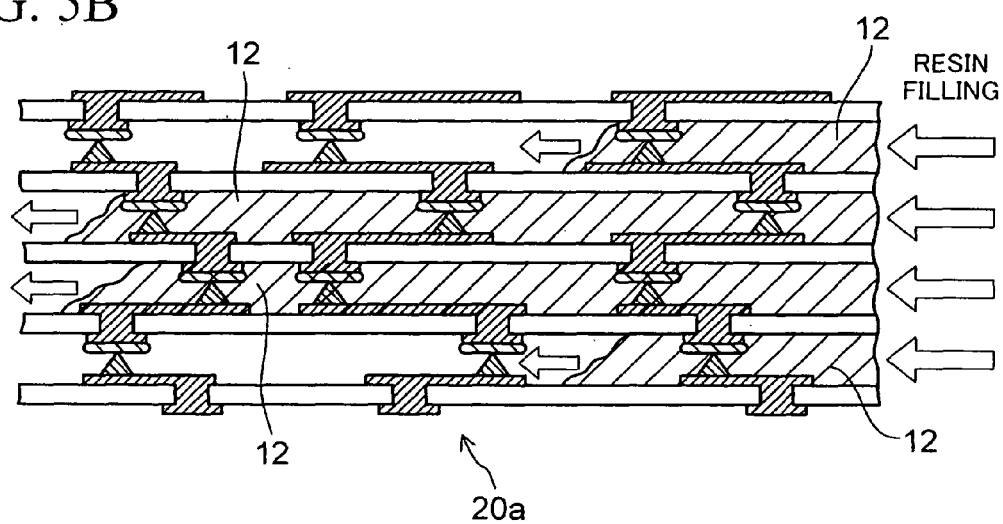

For the first embodiment mentioned above, description has been given taking the case where the process proceeds to the next step (the resin filling) without interposing anything in between the boards on the occasion of the stacking of the unilayer wiring boards 10a to 10e (FIG. 4 and FIGS. 5A and 5B). However, an embodiment may be adopted in which prepregs are interposed in advance into some of the gaps between the boards (for example, the two inner gaps) at the stage of the stacking of the unilayer wiring boards 10a to 10e (at the step shown in FIG. 4). Steps according to this embodiment are shown for example in FIGS. 7 and 8.

Figure 7:
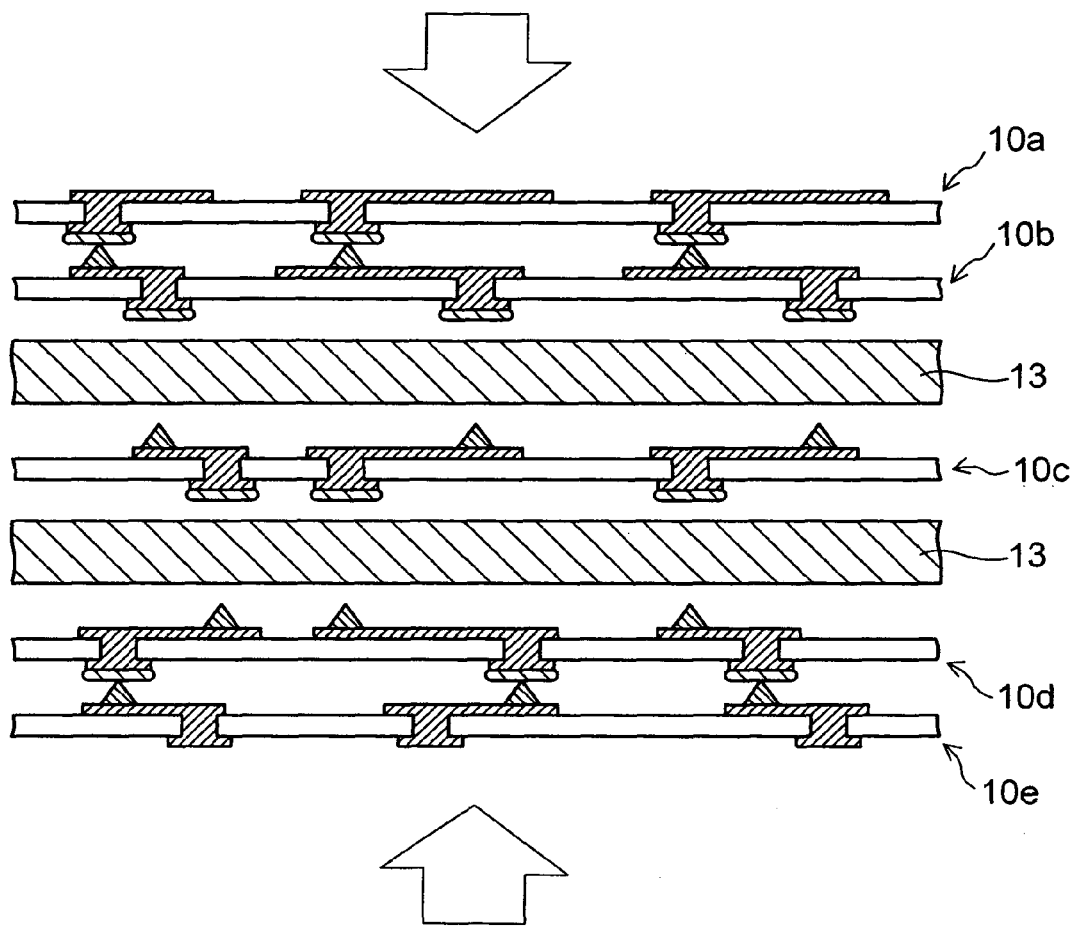
FIG. 7 is a cross-sectional view showing a step according to another embodiment of "process of stacking unilayer wiring boards" at the step shown in FIG. 4.
Figure 8:
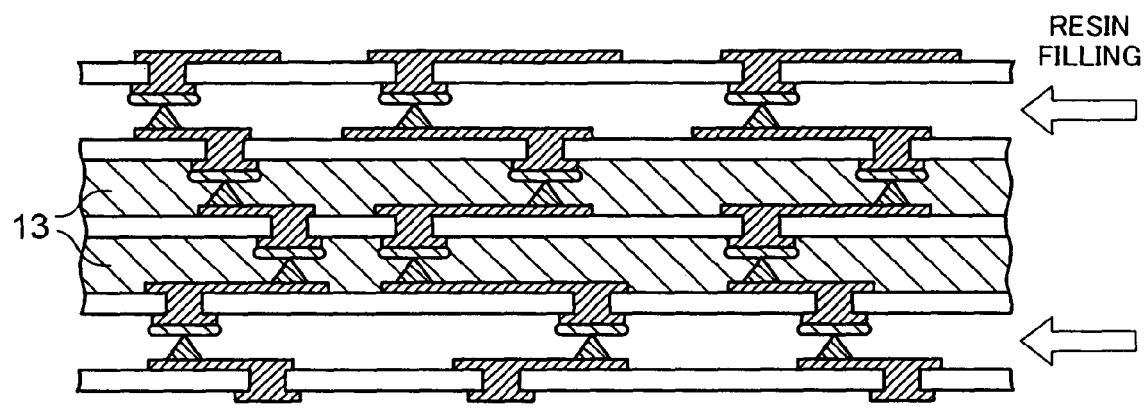
FIG. 8 is a cross-sectional view showing a step of "resin filling process" following the step shown in FIG. 7.

In this embodiment, first, as shown for example in FIG. 7, the boards 10a to 10e are collectively stacked up with prepregs 13 interposed in between the second and third boards (10b and 10c) from the top and in between the third and fourth boards (10c and 10d) from the top. A stack of the boards is then exposed to pressure (or is pressed) or is exposed to heat and pressure (or is hot-pressed) both on top of and on the underside of the stack. When the prepregs 13 are interposed in advance into the two inner gaps at the stage of the stacking of the unilayer boards 10a to 10e as mentioned above, the resin is filled only into the two outer gaps, into which the prepregs 13 are not interposed (see FIG. 8), at a later stage. Consequently, this embodiment enables efficient, smooth resin filling, as compared with the embodiment shown in FIGS. 5A and 5B.

Note, where the prepregs are interposed into all gaps at the stage of the stacking, a situation can possibly arise where all of the Au bumps 6 cannot project through the corresponding prepregs, depending on conditions of application of heat and pressure, and so on. It is desirable, therefore, how many gaps between the adjacent boards of the unilayer boards 10a to 10e the prepregs are interposed into at the stacking stage, and which gap the prepreg is first interposed into at the stacking stage, are appropriately selected according to process conditions.

Figure 6:
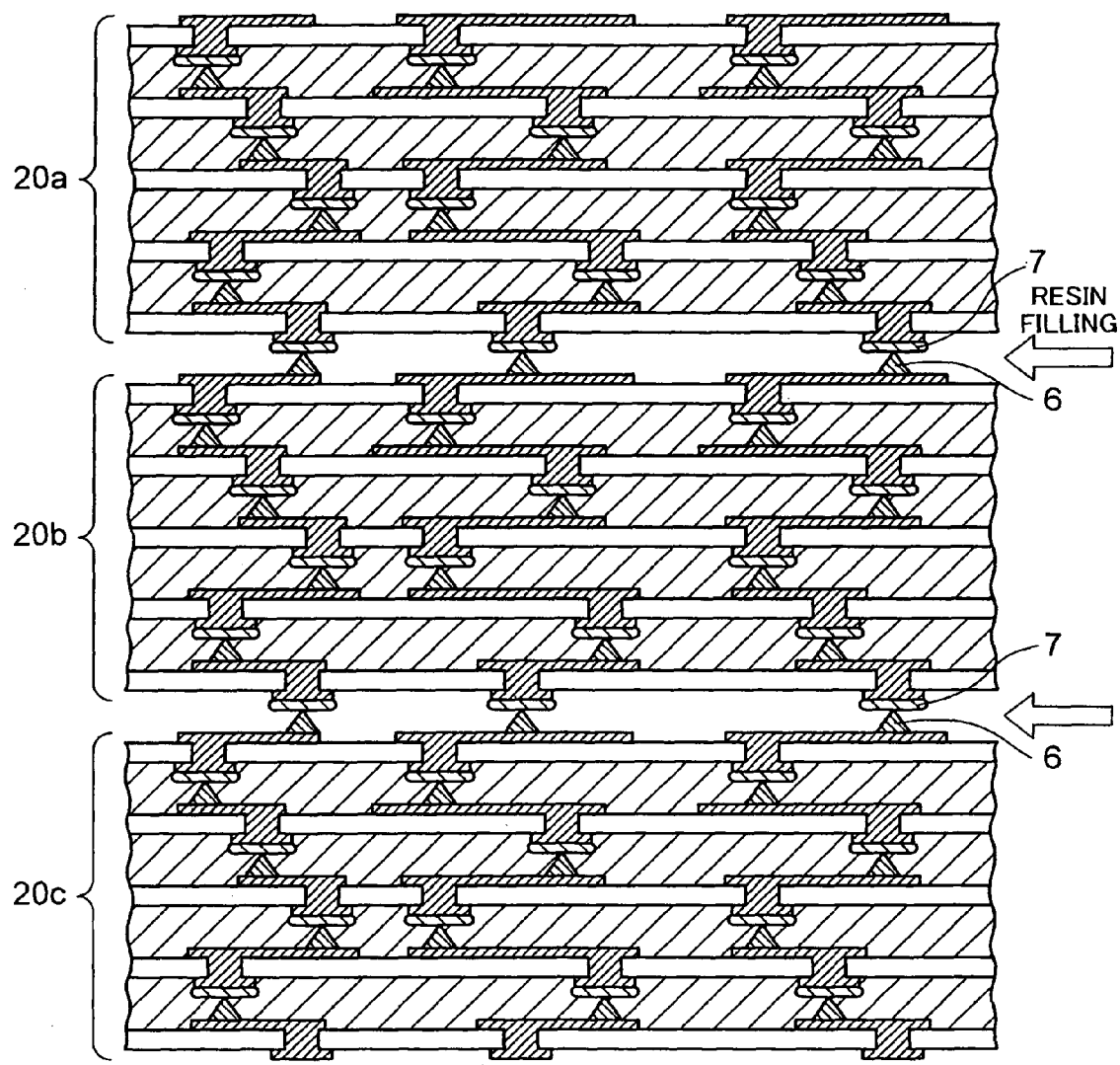
FIG. 6 is a cross-sectional view showing a step following the steps shown in FIGS. 5A and 5B.

Likewise, the step shown in FIG. 6 may include lamination of the prepregs as shown for example in FIG. 7, rather than the filling of the resin into the gaps between the adjacent boards of the multilayer boards 20a to 20c. In this case, likewise, when stacking the multilayer boards 20a to 20c, the multilayer boards 20a to 20c are collectively stacked up, as disposed with the prepregs interposed in between the adjacent multilayer boards (e.g., in the two gaps as shown for example in FIG. 6). A stack of the multilayer boards is then exposed to pressure or to heat and pressure both on top of and on the underside of the stack.

Another embodiment for enabling smooth resin filling, although not shown, may be adopted in which spacers are appropriately disposed at predetermined positions between the adjacent boards, prior to the stacking of the unilayer wiring boards 10a to 10e (FIG. 4). The spacers can take the form of the dispositions of Au bumps, for example. The formation of the Au bumps (or the spacers) can take place concurrently with the formation of the Au bumps 6 (the interboard connection terminals) at the step of FIG. 3E mentioned above. It should be noted that, on the occasion of the formation, the Au bumps must be disposed at such positions as to avoid electrical shorts with the wiring patterns (the wiring layers 5a and 5b). Insulators such as resin balls, photosensitive adhesives or solder resists, rather than the Au bumps, may be appropriately disposed as the spacers. The insulators can be flexibly disposed in any positions since they do not produce any trouble even on the wiring patterns, although the Au bumps must be carefully disposed at the positions as mentioned above.

For the first embodiment mentioned above, description has been given taking the case where, when stacking the unilayer boards 10a to 10e, the Au bumps 6 and the solder 7 are used to provide electrical connections between the adjacent boards. However, it is to be, of course, understood that the means for ensuring the electrical connections between the boards is not limited to this, and other various embodiments are possible.

For example, an embodiment may be adopted in which the solder 7 is not formed on the wiring layer 5b of the unilayer board targeted for connection, and the Au bumps 6 formed on the wiring layer 5a of the unilayer board adjacent to the target unilayer board are press-bonded to the wiring layer (Cu) 5b of the target unilayer board to thereby ensure the electrical connection. Moreover, a solder ball, a copper core ball, a resin core ball, or the like, may be used in place of the Au bump 6. The copper core ball is a ball having a composite structure containing copper as a core and a different kind of metal (mainly, solder or a nickel-gold alloy) that covers the core. The resin core ball is a ball having a composite structure containing a resin as a core and metal (mainly, solder or a nickel-gold alloy) that covers the core.

Moreover, besides the above-mentioned electroplating method and transfer bump method and so on, screen printing method may be used as a bump formation method to form an electrically conductive bump. For example, a method may be used which involves feeding conductive paste to a target for deposition (e.g., the wiring layer 5a on the top shown in FIG. 3E) by means of screen printing, the conductive paste being made of a resin, such as a polyester-base or polyimide-base resin, containing about 60 to 95 weight percent of conductive particles of Au, Ag, solder or the like, and melting the conductive paste by means of reflow, thereby yielding the bump.

Further, ACFs (anisotropic conductive films) or NCFs (non-conductive films) can be used to provide connections between the wiring layers 5a and 5b of the adjacent unilayer boards, and finally, the resin filling takes place (see FIGS. 5A and 5B and FIG. 6). Thereby the same structure and effect can be achieved.

Second Embodiment See FIGS. 9 to 14

Figure 9:
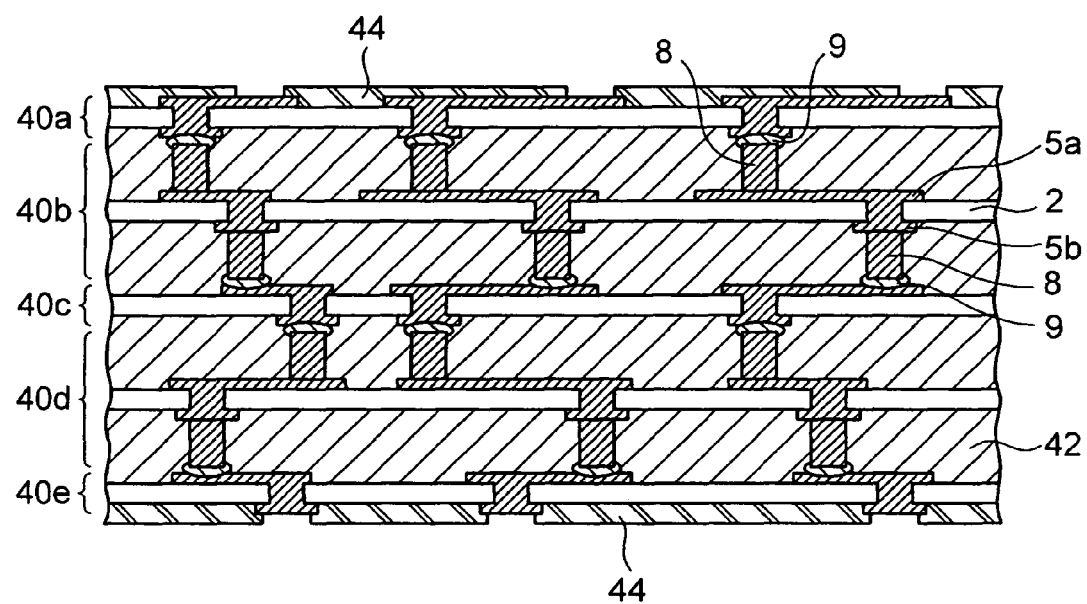
FIG. 9 is a cross-sectional view showing an example of the configuration of a multilayer wiring board as manufactured by use of a method of manufacturing a multilayer wiring board according to a second embodiment of the present invention.

FIG. 9 shows in cross-sectional view an example of the configuration of a multilayer wiring board as manufactured by use of a method of manufacturing a multilayer wiring board according to a second embodiment of the present invention.

As in the case of the first embodiment (FIG. 1) mentioned above, a multilayer wiring board 50 according to the second embodiment includes five unilayer wiring boards 40a, 40b, 40c, 40d and 40e that are fundamental structures that constitute the board 50, resin layers 42 formed in such a manner as to fill in between the boards, and insulating layers 44 that function as protection films formed on the outermost layers of the board 50 (on top of and on the underside of the board 50). The boards 40a to 40e each have the wiring layers 5a and 5b formed by means of patterning in desired shapes on both sides of the prepreg 2 that serves as an insulating base member. Further, the boards other than the uppermost, central and lowermost boards 40a, 40c and 40e, namely, the boards 40b and 40d, each have metal posts (e.g., copper (Cu) posts 8 as employed in the second embodiment) that function as interboard connection terminals, which are formed at predetermined positions on the wiring layers 5a and 5b formed on both sides, and an electrically conductive material 9 formed on the tops of the Cu posts 8.

The boards 40*a* to 40*e* are electrically interconnected through the Cu posts 8 and the electrically conductive materials 9, as shown in FIG. 9. The insulating layers 44 that function as the protection films are formed in such a manner as to cover the entire surface except pad areas defined at predetermined positions on the wiring layers 5*a* and 5*b* of the uppermost and lowermost boards 40*a* and 40*e*, as in the case of the first embodiment.

Figure 10:
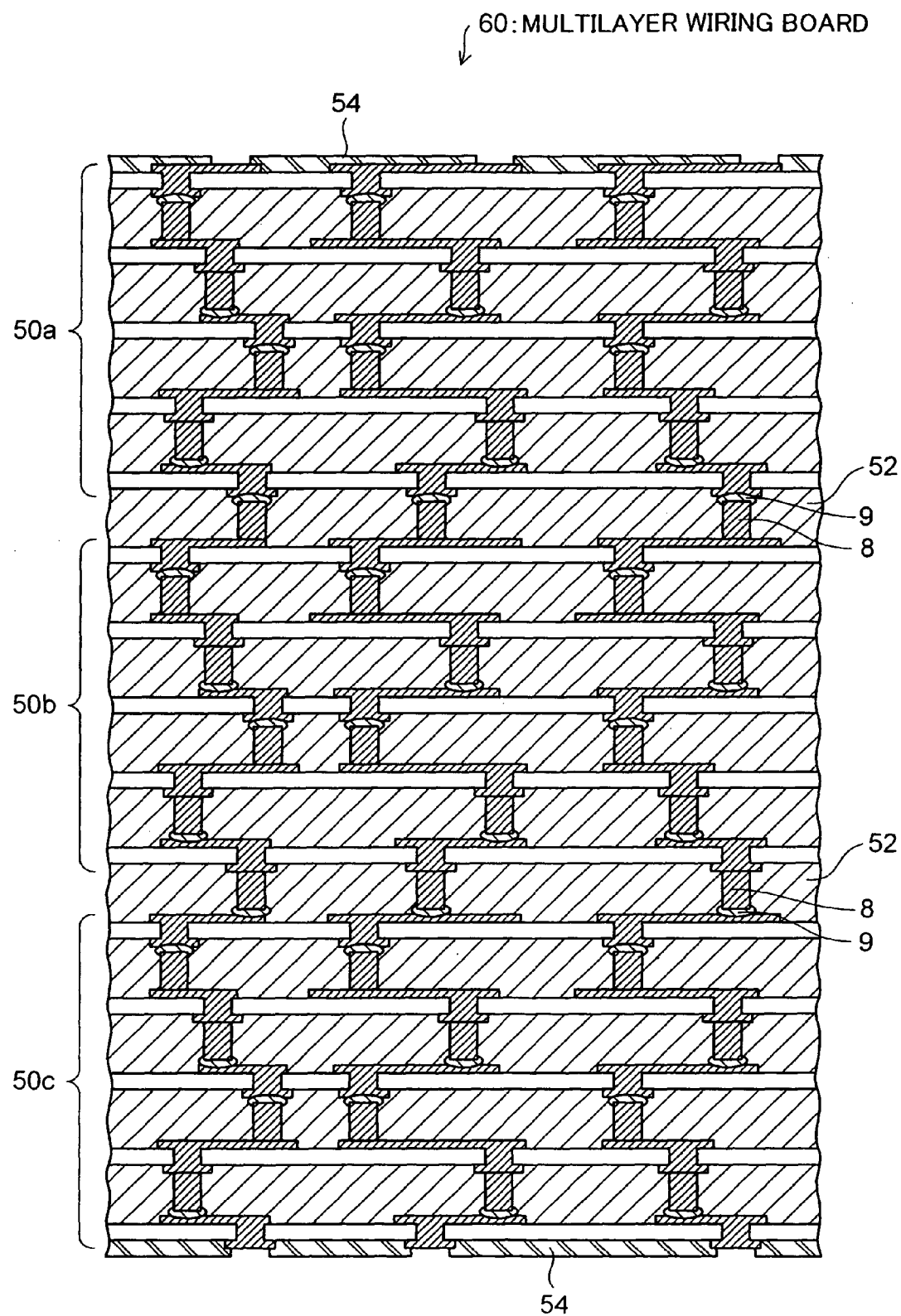
FIG. 10 is a cross-sectional view showing another example of the configuration of a multilayer wiring board as manufactured by use of the method of manufacturing a multilayer wiring board according to the second embodiment of the present invention.

FIG. 10 shows in cross-sectional view another example of the configuration of a multilayer wiring board as manufactured by use of the method of manufacturing a multilayer wiring board according to the second embodiment of the present invention.

As in the case of the first embodiment (FIG. 2) mentioned above, a multilayer wiring board 60 according to an embodiment shown in FIG. 10 is configured of a stack of three structures 50*a*, 50*b* and 50*c*, each of which constitutes a multilayer board. The structures 50*a* to 50*c* each have basically the same configuration as the multilayer wiring board 50 shown in FIG. 9. Incidentally, the structures 50*a* to 50*c* are electrically interconnected through the Cu posts 8 and the electrically conductive materials 9 formed on both sides of the central structure 50*b*. Moreover, resin layers 52 are formed in such a manner as to fill in between the structures 50*a* and 50*b* and between the structures 50*b* and 50*c* (two gaps), and insulating layers 54 that function as protection films are formed on the outermost layers of the board 60 (on top of and on bottom of the board 60). Likewise, the insulating layers 54 are formed in such a manner as to cover the entire surface except the pad areas on the uppermost and lowermost wiring layers.

Specific description will be given with regard to materials for structural members that constitute the multilayer wiring board 50 (FIG. 9) and the multilayer wiring board 60 (FIG. 10) according to the second embodiment, the sizes of the structural members, and others, in connection with a process to be described below.

Description will be given below with regard to a method of manufacturing the multilayer wiring boards 50 and 60 (FIGS. 9 and 10) with reference to FIGS. 11A to 14 illustrating manufacturing steps in the method in sequence.

First, description will be given with regard to a method of fabricating the fundamental structures (unilayer wiring boards) that constitute the multilayer wiring boards 50 and 60 according to the second embodiment.

Figure 11A:
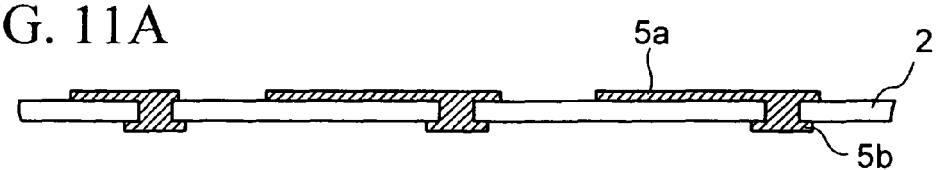
FIGS. 11A to 11E are cross-sectional views showing steps in the method of manufacturing a multilayer wiring board according to the second embodiment.
Figure 11B:
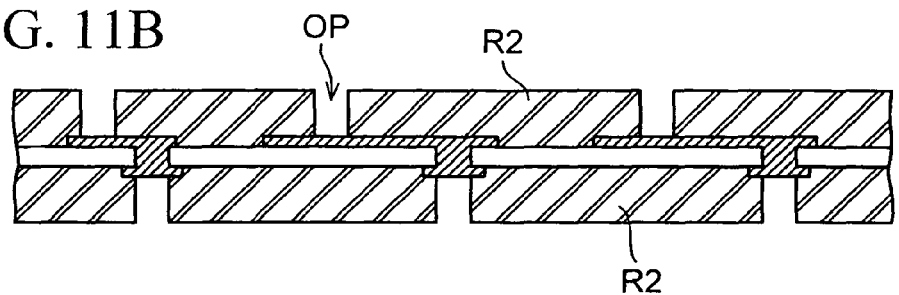
Figure 11C:
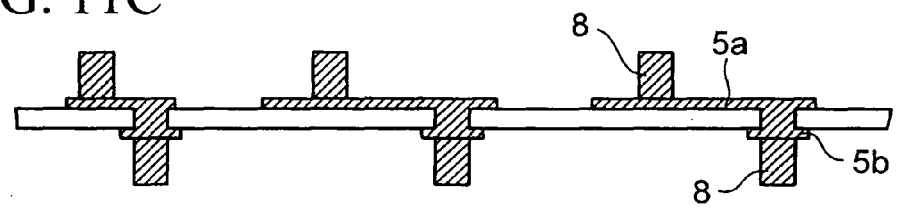
Figure 11D:
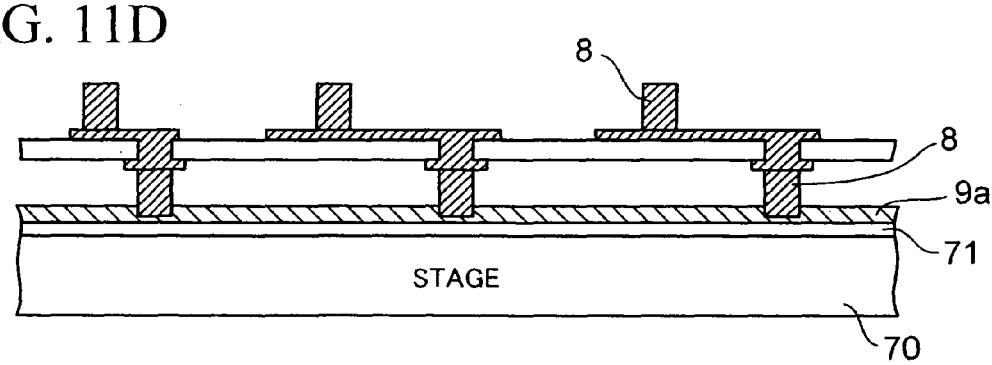

Referring to FIGS. 11A to 11E and first to FIG. 11A, there is shown the structure having the wiring layers 5*a* and 5*b* formed by means of patterning in the desired shapes on both sides of the prepreg 2 that serves as the insulating base member, which is fabricated at a first step (FIG. 11A). This structure can be fabricated through the same process as the process performed at the steps shown in FIGS. 3A to 3D according to the first embodiment mentioned above. However, the pretreatment (e.g., Ni plating on the wiring layers) for preventing diffusion is not necessary after the cleaning of the surfaces of the wiring layers 5*a* and 5*b*, as distinct from the first embodiment. Correspondingly, the process becomes simpler as compared with the first embodiment.

At the next step (FIG. 11B), plating resists are formed on both sides of the structure obtained at the previous step, and openings are formed in predetermined areas of the plating resists. For example, resist layers R2 are formed by laminating photosensitive dry films (each having a thickness of the order of 100 μm) on both sides of the structure by means of thermocompression bonding; then subjecting the dry films to exposure and development (i.e., subjecting the dry films to patterning) by use of masks (not shown) formed by means of patterning in accordance with the shape of the copper (Cu) post to be formed later; and etching away areas to be removed (forming openings OP).

At the next step (FIG. 11C), the Cu posts 8 each having a height of the order of 100 μm are formed by plating the exposed surfaces of the wiring layers 5*a* and 5*b* with copper (Cu) by means of electroplating, with the wiring layers 5*a* and 5*b* being used as power feed layers, by using as masks the resist layers R2 formed by means of patterning.

At the next step (FIG. 11D), a stage 70 for use in the transfer of the electrically conductive material to the tops of the Cu posts 8 is first prepared by being covered with conductive paste 9*a*, such as silver (Ag) or copper (Cu), having an adhesive layer and serving as the electrically conductive material, with an insulating sheet 71 such as a PET (polyethylene terephthalate) film in between. Then, the structure (the unilayer wiring board having the Cu posts 8 formed thereon) obtained at the previous step is mounted on the stage 70 (the conductive paste 9*a*). Thereby, the electrically conductive material is transferred to the tops of the Cu posts 8 on one side, which is brought into contact with the conductive paste 9*a*. This transfer is performed in the same manner on the Cu posts 8 on the other side (e.g., on the upper side as shown for example in FIG. 11D).

Figure 11E:
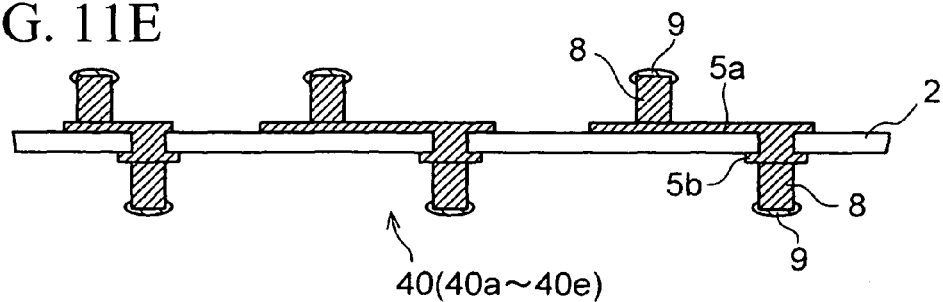

The above steps lead to fabrication of the structure (the unilayer wiring board 40) having the wiring layers 5*a* and 5*b* formed in the desired shapes on both sides of the prepreg 2 by means of patterning, the Cu posts 8 formed at the predetermined positions on the wiring layers 5*a* and 5*b*, and the electrically conductive material 9 transferred to the tops of the Cu posts 8, as shown in FIG. 11E.

At the next step (FIG. 12), a desired number of unilayer wiring boards 40 fabricated through the above steps are stacked up. First, five unilayer wiring boards 40 (40*a* to 40*e*) are prepared. Of the five boards, the boards 40*a*, 40*c* and 40*e* disposed in the uppermost, central and lowermost layers are prepared without having the Cu post 8 and the electrically conductive material 9 (without undergoing the steps shown in FIGS. 11B to 11E).

Figure 12:
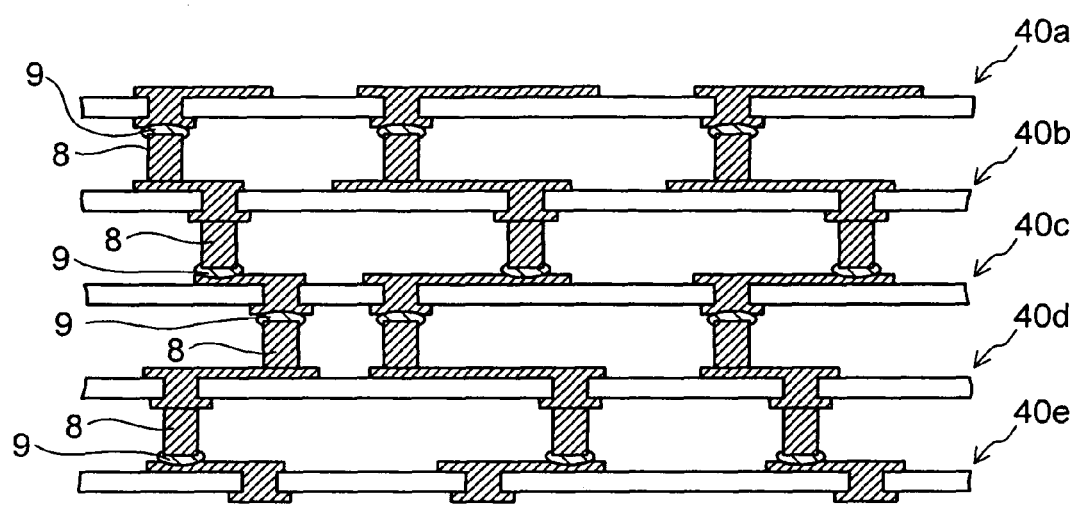
FIG. 12 is a cross-sectional view showing a step following the steps shown in FIGS. 11A to 11E.

Then, the boards 40*a*, 40*b*, 40*c*, 40*d* and 40*e* are stacked up, as aligned in such a manner that the wiring layers are connected through the Cu posts 8 and the electrically conductive materials 9 formed on both sides of the boards 40*b* and 40*d* disposed in the second and fourth layers from the top, as shown in FIG. 12. On this occasion, pin lamination is used to pin the relative positions of the boards in the same manner as the process performed at the step shown in FIG. 4. Thereby, the five unilayer wiring boards 40*a* to 40*e* are electrically interconnected through the Cu posts 8 and the electrically conductive materials 9.

Further, a reflow furnace and baking are used in combination as needed to melt the electrically conductive material 9 (such as Ag or Cu) and thereby provide tight connections to the wiring layers (Cu) 5*a* and 5*b*. Incidentally, a reflow process or the like is not necessarily required, and press bonding using molding pressure alone for connections between the electrically conductive material 9 and the wiring layers 5*a* and 5*b* can ensure sufficient electrical connections therebetween.

At a next step (FIGS. 13A and 13B), the resin 42 is filled into gaps (four gaps) between adjacent boards of the unilayer boards 40*a* to 40*e* stacked up at the previous step. A material for the filling resin 42 and a filling method therefor are the same as the material and method for the process performed at the steps shown in FIGS. 5A and 5B. In the second embodiment, specifically, the resin 42 is first filled into two inner gaps (the gap between the boards 40*b* and 40*c* and the gap between the boards 40*c* and 40*d*) (FIG. 13A), and after a lapse of a given time, the resin 42 is then filled into two outer gaps (the gap between the boards 40*a* and 40*b* and the gap between the boards 40*d* and 40*e*) (FIG. 13B). On this occasion, the order in which the resin in the corresponding gaps undergoes vacuum suction on the opposite side to the resin filling side is changed according to resin injection order, as in the case of the embodiment previously mentioned. When a "time lag" is provided to fill the resin 42 into the gaps between the adjacent boards of the boards 40*a* to 40*e* as mentioned above, smooth resin filling becomes possible. As in the case of the embodiment previously mentioned, it is to be, of course, understood that the construction of a mold for use in the resin filling may be changed to provide the "time lag," the filling order of the resin 42 may be the reverse of the order shown in FIGS. 13A and 13B, and the number of gaps filled with the resin at a time is not limited to two.

The above steps lead to fabrication of the structure (the multilayer board 50*a*) formed of a stack of the five unilayer wiring boards 40*a* to 40*e*, having the resin layers 42 formed in such a manner as to fill in between the stacked boards.

When, at this stage, solder resist layers (the insulating layers 44) that function as the protection films are formed on the outermost layers of the structure (on top of and on the underside of the multilayer board 50*a*), the multilayer wiring board 50 shown in FIG. 9 can be manufactured. The solder resist layers 44 can be formed in the same manner as the process performed at the step shown in FIG. 11B. Specifically, the formation of the solder resist layers 44 can be accomplished by laminating the photosensitive dry films (or applying coverings of the liquid photoresist), and forming the resists in desired shapes by means of patterning.

To manufacture the multilayer wiring board 60 shown in FIG. 10, the process proceeds to a next step without forming the protection films (the solder resist layers 44) at this stage.

Specifically, at the next step (FIG. 14), a desired number of multilayer boards fabricated through the above steps are stacked up. First, three multilayer boards are prepared. One of the three multilayer boards is the multilayer board 50*a* fabricated through the above steps (FIG. 13B), and the other two, namely, the multilayer boards 50*b* and 50*c*, are different from the multilayer board 50*a* in the pattern shapes of the wiring layers 5*a* and 5*b*, the dispositions of the Cu posts 8 and the electrically conductive material 9, and so on. The multilayer board 50*b* disposed inside has the Cu posts 8 and the electrically conductive materials 9 formed at the predetermined positions on the wiring layers both on top of and on the underside of the board 50*b*.

Then, the multilayer boards 50*a*, 50*b* and 50*c* are stacked up, as aligned in such a manner that the wiring layers are connected through the Cu posts 8 and the electrically conductive materials 9 formed on both sides of the multilayer board 50*b* disposed inside. On this occasion, pin lamination is used to pin the relative positions of the multilayer boards in the same manner as the process performed at the step shown in FIG. 4. Thereby, the multilayer boards 50*a* to 50*c* are electrically interconnected through the Cu posts 8 and the electrically conductive materials 9.

Further, the resin 52 (FIG. 10) is filled into gaps (two gaps) between adjacent boards of the multilayer boards 50*a* to 50*c* stacked up, by means of transfer molding or the like. This leads to fabrication of the structure formed of a stack of the three multilayer boards 50*a* to 50*c*, having the resin layers 52 formed in such a manner as to fill in between the stacked multilayer boards.

When solder resist layers (the insulating layers 54) that function as the protection films are then formed on the outermost layers of the structure (on top of and on the underside of the structure), the multilayer wiring board 60 shown in FIG. 10 can be manufactured. The solder resist layers 54 can be formed in the same manner as the formation of the solder resist layers 44 (FIG. 9) mentioned above.

According to the method of manufacturing a multilayer wiring board according to the second embodiment (FIGS. 11A to 14), as described above, the method according to the second embodiment can achieve the same functional effects as the manufacturing method according to the first embodiment mentioned above. This is because basically the same approach as the method according to the first embodiment is adopted in the second embodiment, regardless of the difference between the first and second embodiments in that the first embodiment uses the Au bump 6 as the inter-board connection terminal, whereas the second embodiment uses the Cu post 8 (and the electrically conductive material 9) as the inter-board connection terminal.

Moreover, the second embodiment has a peculiar, effect of being adaptable to fine-diameter formation and pitch reduction because of using the Cu post 8 as the inter-board connection terminal. Specifically, the second embodiment can use plating method as mentioned above to form the Cu post 8 with an area of fine diameter, whereas the conventional multilayer wiring formation technique using the build-up process has used a laser-based hole formation process for via hole formation. The conventional technique hence has required a land area of corresponding size around a via hole opening, which in turn becomes a factor responsible for hindrance to the fine-diameter formation or the pitch reduction. Moreover, the electrically conductive material 9 functions as an absorption layer to absorb variations in the heights of the Cu posts 8 at the occurrence of the variations.

Figure 13A:
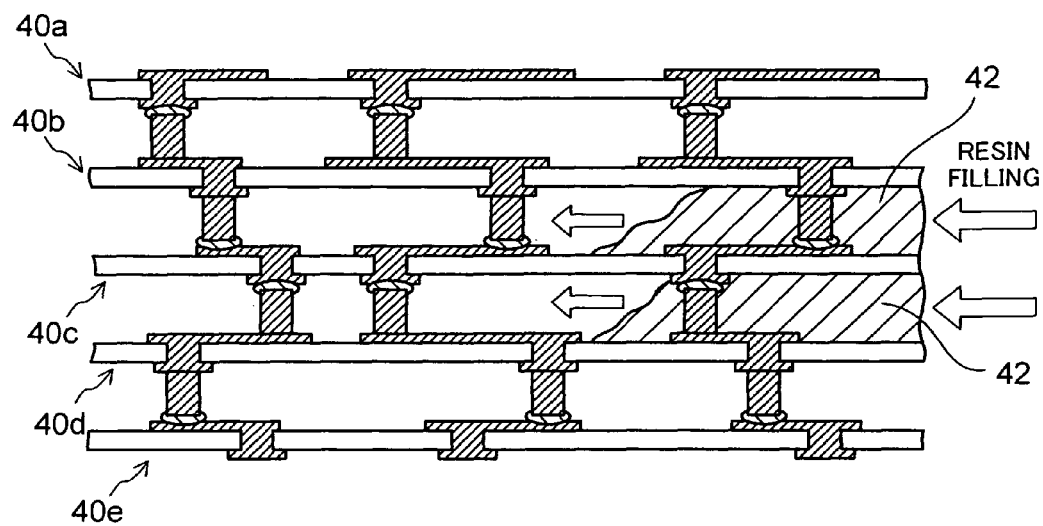
FIGS. 13A and 13B are cross-sectional views showing steps following the step shown in FIG. 12.
Figure 13B:
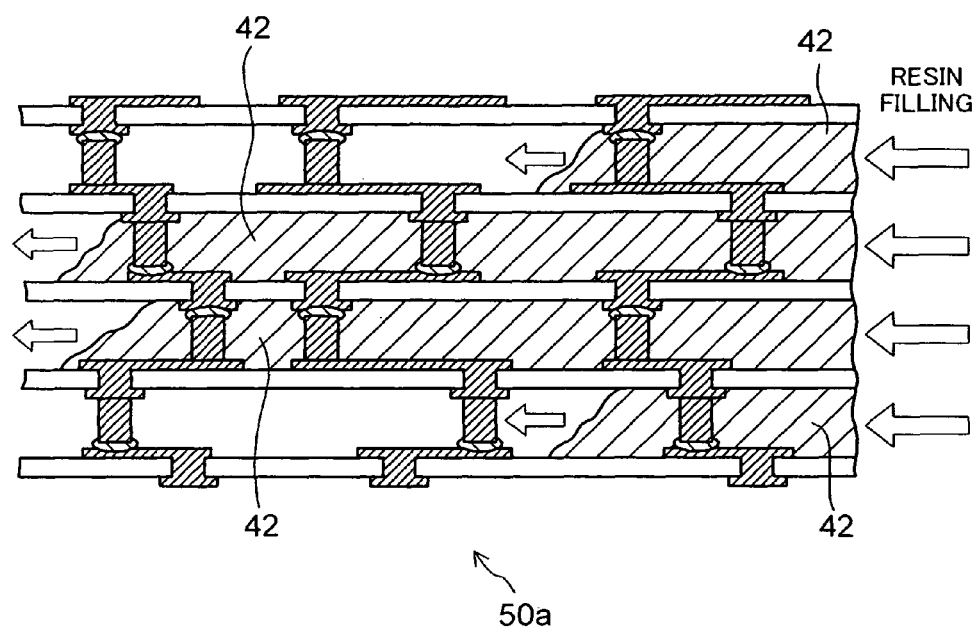
Figure 14:
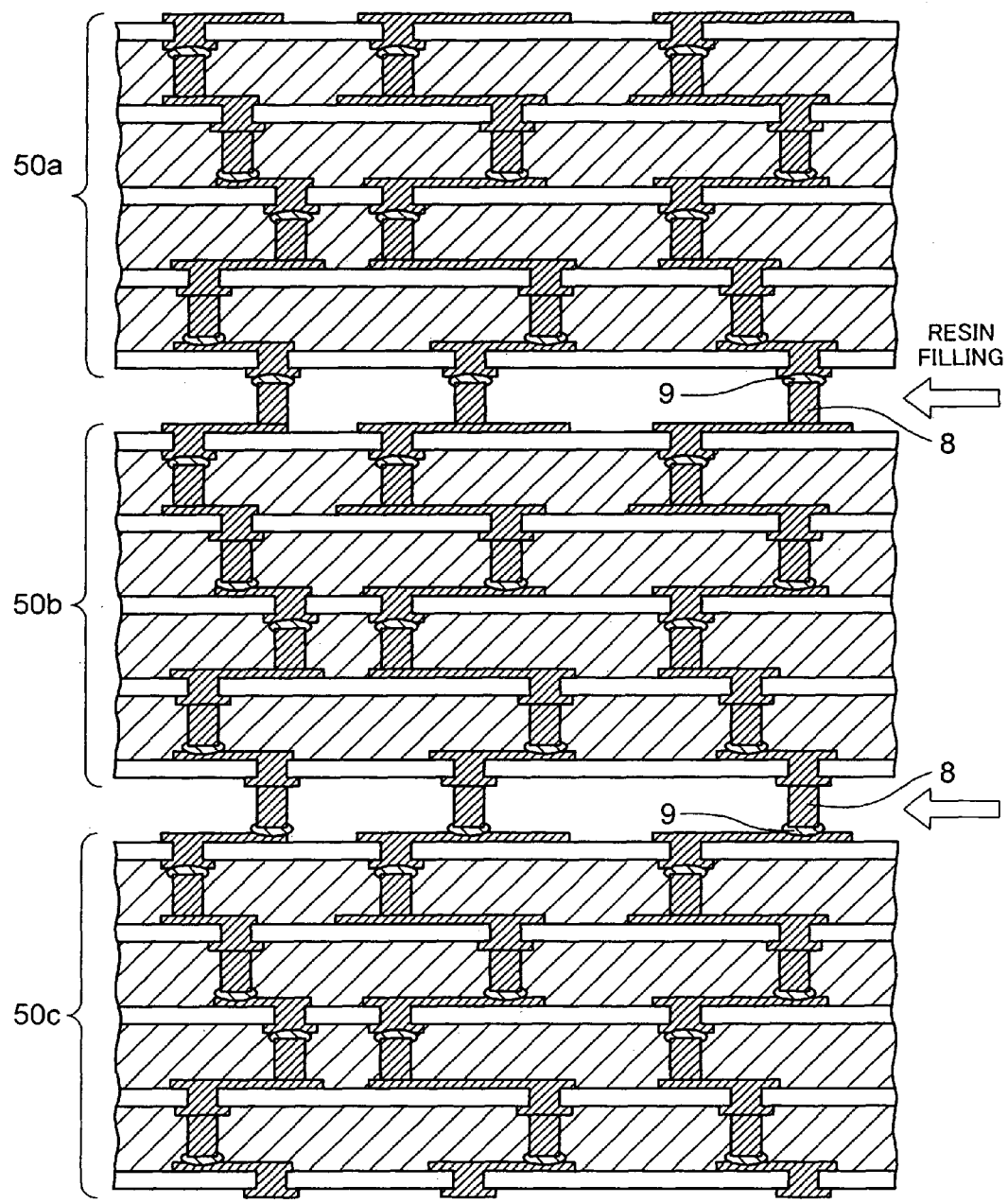
FIG. 14 is a cross-sectional view showing a step following the steps shown in FIGS. 13A and 13B.

Also for the second embodiment, as in the case of the first embodiment mentioned above, description has been given taking the case where the process proceeds to the next step (the resin filling) without interposing anything between the boards on the occasion of the stacking of the unilayer wiring boards 40*a* to 40*e* (FIG. 12 and FIGS. 13A and 13B). However, an embodiment may be adopted in which prepregs are interposed in advance into some of the gaps between the boards at the stage of the stacking of the unilayer boards 40*a* to 40*e* (at the step shown in FIG. 12). Since this embodiment is the same as the above-mentioned first embodiment shown in FIGS. 7 and 8 with regard to this case, detailed description thereof is omitted.

Also in this case, where the prepregs are interposed into all gaps at the stage of the stacking, a situation can possibly arise where all of the Cu posts 8 cannot project through the corresponding prepregs, depending on conditions of application of heat and pressure, and so on. It is desirable, therefore, how many gaps between the adjacent boards of the unilayer boards 40*a* to 40*e* the prepregs are interposed into at the stacking stage, and which gap the prepreg is first interposed into at the stacking stage, are appropriately selected according to process conditions. Likewise, the step shown in FIG. 14 may include lamination of the prepregs as shown for example in FIG. 7, rather than the filling of the resin into the gaps between the adjacent boards of the multilayer boards 50*a* to 50*c*.

As in the case of the first embodiment mentioned above, moreover, spacers (e.g., Au bumps, insulators such as resin balls, or the like) may be appropriately disposed at predetermined positions between the adjacent boards of the unilayer boards 40*a* to 40*e* to be stacked, in order to enable smooth resin filling.

Moreover, insulating layers (not shown) such as solder resists may be formed with an appropriate thickness (a layer thickness less than the height of the Cu post 8) in such a manner as to cover the wiring layers 5a and 5b, prior to the formation of the Cu posts 8 (i.e., before the process proceeds to the step shown in FIG. 11B), after at the step shown in FIG. 11A the wiring layers 5a and 5b are formed in the desired shapes on both sides of the prepreg 2 by means of patterning. The formation of such insulating layers makes it possible to prevent the electrically conductive material 9 from coming into contact with the wiring layers 5a and 5b (electrically shorting therewith), even in the event of leakage of the electrically conductive material 9 transferred to the tops of the Cu posts 8 at a later step.

Further, it is to be, of course, understood that the number of unilayer wiring boards 40 stacked is not limited to five, although description has been given for the second embodiment mentioned above, taking the case where the five unilayer wiring boards 40 fabricated through the steps shown in FIGS. 11A to 11E are stacked up (FIG. 12). To stack plural boards other than the five boards, some of the boards disposed inside are prepared by forming the Cu posts 8 and the electrically conductive materials 9 only on the wiring layer 5a (or the wiring layer 5b) on one side, depending on the number of stacked boards.

Incidentally, for the first and second embodiments mentioned above, description has been given taking the case where the insulating material alone, such as the resin or the prepreg, is interposed between the unilayer boards 10a to 10e, between the unilayer boards 40a to 40e, between the multilayer boards 20a to 20c, and between the multilayer boards 50a to 50c. However, a semiconductor (e.g., silicon) device, a chip component or the like may be buried in the gaps between the unilayer boards, as needed.

What is claimed is:

1. A method of manufacturing a multilayer wiring board, comprising the steps of:
    fabricating a unilayer wiring board having wiring layers formed in desired shapes on both sides of an insulating base member by means of patterning, having a metal post formed on the wiring layer on at least one side of the insulating base member, and having an electrically conductive material formed on the top of the metal post;
    preparing and stacking up a desired number of unilayer wiring boards, including preparing the boards disposed in at least the uppermost and lowermost layers without having a metal post and an electrically conductive material, and positioning and stacking up the boards in such a manner that the wiring layers of the boards are interconnected through metal posts and electrically conductive materials formed on the boards disposed inside, to thereby establish an electrical connection between stacked boards;
    filling resin into gaps between the stacked boards in which adjacent boards are electrically connected to each other; and
    forming insulating layers on both sides of a multilayer board obtained through the above steps, in such a manner that the insulating layers cover the entire surface except pad areas defined at predetermined positions on the respective wiring layers.

2. A method of manufacturing a multilayer wiring board, comprising the steps of:
    fabricating a unilayer wiring board having wiring layers formed in desired shapes on both sides of an insulating base member by means of patterning, having a metal post formed on the wiring layer on at least one side of the insulating base member, and having an electrically conductive material formed on the top of the metal post;
    preparing and stacking a desired number of unilayer wiring boards, including preparing the boards disposed in at least the uppermost and lowermost layers without having a metal post and an electrically conductive material, and positioning and stacking up the boards in such a manner that the wiring layers of the boards are interconnected through metal posts and electrically conductive materials formed on the boards disposed inside, to thereby establish an electrical connection between the stacked boards;
    filling resin into gaps between the stacked boards in which adjacent boards are electrically connected to each other;
    preparing and stacking up a desired number of multilayer boards obtained through the above steps, including preparing the multilayer board disposed inside with a metal post formed on the wiring layer on at least one side thereof and with an electrically conductive material formed on the top of the metal post, and positioning and stacking up the multilayer boards in such a manner that the wiring layers of the multilayer boards are interconnected through metal posts and electrically conductive materials formed on the multilayer boards disposed inside, to thereby establish an electrical connection between the stacked multilayer boards;
    filling resin into gaps between the stacked multilayer boards in which adjacent multilayer boards are electrically connected to each other; and
    forming insulating layers on both sides of a structure obtained through the above steps, in such a manner that the insulating layers cover the entire surface except pad areas defined at predetermined positions on the respective wiring layers.

3. The method of manufacturing a multilayer wiring board, according to claim 1, wherein the filling of resin into respective gaps between the stacked boards includes: first filling resin into a gap between two inner boards; and then filing resin into a gap between the inner boards and an outer board that is next to the inner boards.

4. The method of manufacturing a multilayer wiring board, according to claim 1, wherein, prior to the stacking of the unilayer wiring boards, a spacer is disposed at a predetermined position between the boards.

5. The method of manufacturing a multilayer wiring board, according to claim 1, wherein the step of fabricating a unilayer wiring board includes forming insulating layers in such a manner that the insulating layers cover the wiring layers, prior to the formation of the metal post, after the formation of the wiring layers on both sides of the insulating base member.

6. The method of manufacturing a multilayer wiring board, according to claim 1, wherein, when filling resin into respective between the stacked boards, a time lag is provided to fill the resin into the gaps between the boards in time sequence.

7. The method of manufacturing a multilayer wiring board, according to claim 1, wherein,
    when preparing and stacking up a desired number of unilayer wiring boards, the boards are collectively stacked up with prepregs interposed in advance into a predetermined number of gaps between the boards, and
    when filling resin into gaps between the stacked boards, the resin is filled into the other remaining gaps into which the prepregs are not interposed.

* * * * *

UNITED STATES PATENT AND TRADEMARK OFFICE
CERTIFICATE OF CORRECTION

| | | |
|---|---|---|
| PATENT NO. | : 8,096,049 B2 | Page 1 of 1 |
| APPLICATION NO. | : 12/929090 | |
| DATED | : January 17, 2012 | |
| INVENTOR(S) | : Tetsuya Koyama et al. | |

It is certified that error appears in the above-identified patent and that said Letters Patent is hereby corrected as shown below:

ON THE TITLE PAGE:

Insert Item (30):

-- (30) Foreign Application Priority Data: January 12, 2007 (JP) 2007-004595 --.

Signed and Sealed this
Twentieth Day of March, 2012

David J. Kappos
*Director of the United States Patent and Trademark Office*